(12) United States Patent
Gilmore

(10) Patent No.: US 6,993,295 B2
(45) Date of Patent: Jan. 31, 2006

(54) WEAVER IMAGE REJECT MIXER WITH FINE RESOLUTION FREQUENCY STEP SIZE

(75) Inventor: Robert P. Gilmore, Poway, CA (US)

(73) Assignee: Intel Corporation, Santa Clara, CA (US)

( * ) Notice: Subject to any disclaimer, the term of this patent is extended or adjusted under 35 U.S.C. 154(b) by 421 days.

(21) Appl. No.: 10/043,722

(22) Filed: Jan. 8, 2002

(65) Prior Publication Data

US 2003/0129959 A1   Jul. 10, 2003

(51) Int. Cl.
*H04B 1/40* (2006.01)
*H04B 7/00* (2006.01)

(52) U.S. Cl. ............ 455/76; 455/76; 455/209; 455/260; 455/285

(58) Field of Classification Search .......... 455/76, 455/86, 196.1, 209, 260, 285, 74, 77, 118, 455/120, 178.1, 183.1, 189.1, 190.1, 191.1, 455/280, 303–306, 313–316, 323, 326, 333, 455/337–339
See application file for complete search history.

(56) References Cited

U.S. PATENT DOCUMENTS

| | | | | |
|---|---|---|---|---|
| 4,910,800 A | * | 3/1990 | Chung | 455/316 |
| 5,303,417 A | * | 4/1994 | Laws | 455/314 |
| 5,507,025 A | * | 4/1996 | Rodeffer | 455/266 |
| 6,484,038 B1 | * | 11/2002 | Gore et al. | 455/552.1 |
| 6,678,503 B1 | * | 1/2004 | Black et al. | 455/76 |

OTHER PUBLICATIONS

Donald K. Weaver, Jr., A Third Method of Generation and Detection of Single–Sideband Signals, Proceedings of the IRE, vol. 44, No. 12, Published on Dec., 1956, pp. 1703–1705, The Institute of Radio Engineers, Inc.

* cited by examiner

*Primary Examiner*—Simon Nguyen
(74) *Attorney, Agent, or Firm*—James S. Finn

(57) ABSTRACT

Methods and apparatus, in accordance with the present invention, use at least two phase-locked loop based frequency synthesizers to provide a synthesized frequency output having a step size of X, where X is less than the step size of any of the at least two phase-locked loop based oscillators. By combining a first signal having a first frequency, with the output of a first frequency synthesizer having a first frequency step size, NX, to produce an intermediate signal which is in turn combined with the output a second frequency synthesizer having a second frequency step size, MX, an output signal is produced. M and N are related such that i times M=N±1, and i, M and N are integers. By varying the output frequency of the first and second frequency synthesizers, the frequency of the output signal is changed by steps of X, where X is less than the step size of either the first or second frequency synthesizers.

35 Claims, 3 Drawing Sheets

WEAVER IMAGE REJECT MIXER WITH FINE RESOLUTION FREQUENCY STEP SIZE

BACKGROUND OF THE INVENTION

1. Field of the Invention

The present invention relates generally to the field of wireless communication, and more particularly relates to methods and apparatus for frequency synthesis with arbitrarily fine frequency step sizes which are smaller than the frequency step sizes of any of a plurality of adjustable oscillators which are based on phase-locked loops.

2. Background Information

Advances in semiconductor manufacturing processes have resulted in the production of integrated circuits having many millions of transistors as well as other active and passive components. The same advances that have provided the reduction in physical dimensions necessary to integrate millions of electrical elements on a single chip, also provide dramatic increases in operating frequency for these integrated circuits. Integrated circuits implementing logic functions now commonly operate at several GHz, with an order of magnitude increase in operating frequency expected in a few years.

The miniaturization of physical dimensions, coupled with the increase in functionality made possible by such advances in semiconductor technology, have also led to the rapid growth of numerous classes of electronic products, many of which can benefit from the capability of wireless communication. Examples include, but are not limited to, computers, personal digital assistants, cellular telephones, and many others, all which may benefit from wireless access to one or more communication networks. The expression "wireless communication" commonly refers to radio-based communication.

Although superheterodyne architectures have been used in previous generations of radios, implementation of radios in integrated circuits for consumer electronic products can be made more cost-effective through the use of image reject mixers. The Weaver Image Reject Mixer is a known architecture that uses two local oscillators in its implementation.

It is expected that many consumer electronic products having wireless communication capability will need to send and/or receive information over a number of relatively narrow channels within an allocated portion of the electromagnetic spectrum. In order to tune transmitters and/or receivers which use an image reject mixer architecture, such as the Weaver image reject mixer, conventional designs have attempted to adjust the frequency of the local oscillators in small steps.

What is needed are methods and apparatus for achieving a fine resolution frequency step size.

SUMMARY OF THE INVENTION

Briefly, methods and apparatus, in accordance with the present invention, use at least two phase-locked loop based frequency synthesizers to provide a synthesized frequency output having a step size of X, where X is less than the step size of any of the at least two phase-locked loop based oscillators.

By combining a first signal having a first frequency, with the output of a first frequency synthesizer having a first frequency step size, NX, to produce an intermediate signal which is in turn combined with the output a second frequency synthesizer having a second frequency step size, MX, an output signal is produced. M and N are related such that i times M=N±1, and i, M and N are integers. By varying the output frequency of the first and second frequency synthesizers, the frequency of the output signal is changed by steps of X, where X is less than the step size of either the first or second frequency synthesizers.

BRIEF DESCRIPTION OF THE DRAWINGS

The present invention is described herein by way of exemplary embodiments, but not limitations, illustrated in the accompanying drawings in which like references denote similar elements.

DETAILED DESCRIPTION

In the following description, various aspects of the present invention will be described. However, it will be apparent to those skilled in the art, that the present invention may be practiced with only some, or with all aspects of the present invention. For purposes of explanation, specific numbers, materials and configurations are set forth in order to provide a thorough understanding of the present invention. However, it will also be apparent to those skilled in the art, that the present invention may be practiced without one or more of those specific details. In other instances, well-known features are omitted or simplified in order not to obscure the present invention.

Reference herein to "one embodiment", "an embodiment", or similar phrases or formulations, means that a particular feature, structure, or characteristic described in connection with the embodiment, is included in at least one embodiment of the present invention. Thus, the appearances of such phrases or formulations herein are not necessarily all referring to the same embodiment. Furthermore, various particular features, structures, or characteristics may be combined in any suitable manner in one or more embodiments.

Figure 1:
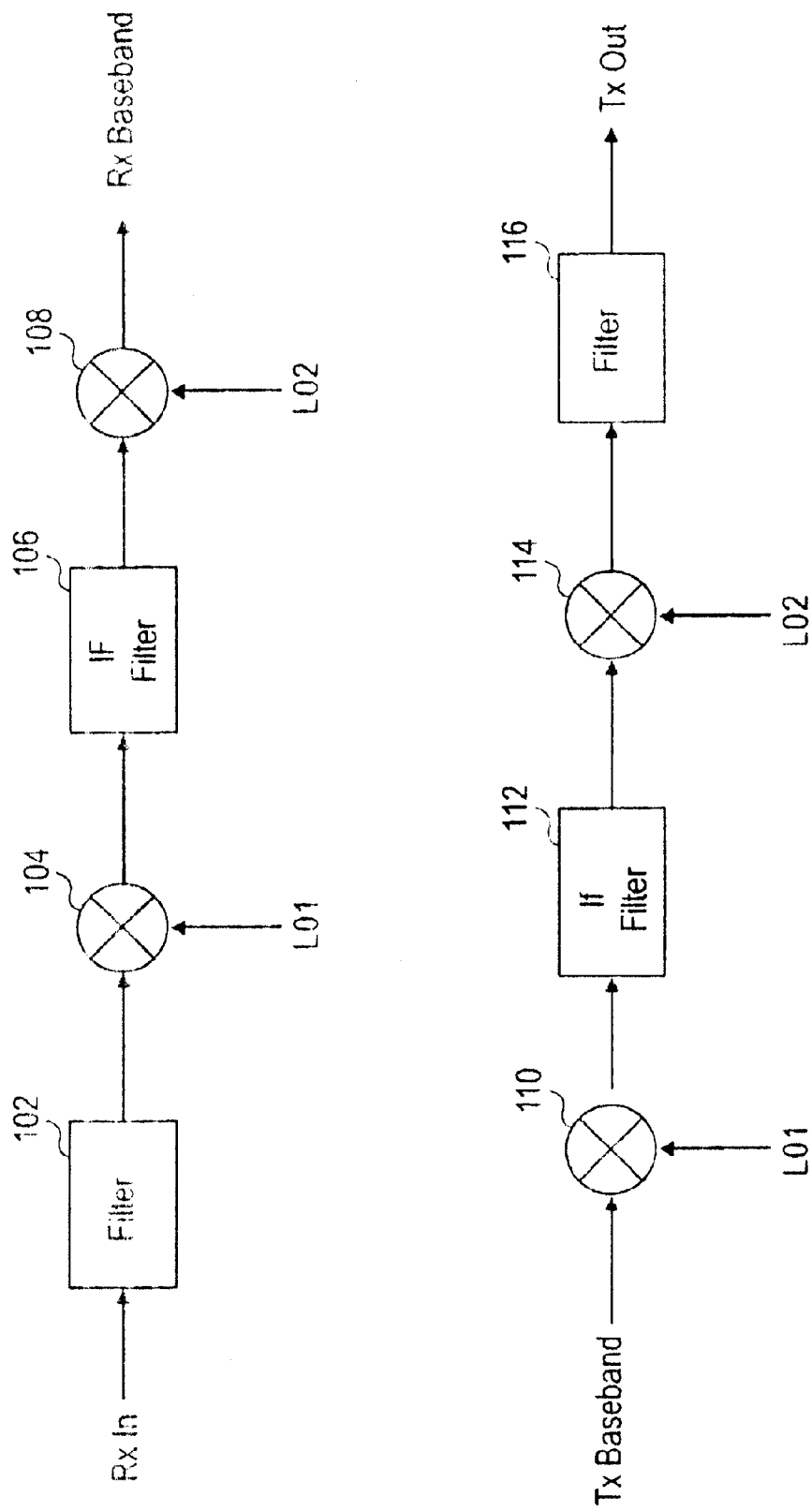
FIG. 1 is a circuit block diagram of a conventional superheterodyne radio architecture for receiver and transmitter paths that include filters for image rejection.

Conventionally, superheterodyne receivers or transmitters reject an image using filters. However, in an effort to design a radio such that it may be implemented in a single chip, it is desired to eliminate the external filters traditionally used in such superheterodyne implementations. FIG. 1 is a circuit block diagram of a conventional superheterodyne radio architecture for receiver and transmitter paths that include filters for image rejection. On the receive side, an input signal (Rx In) is passed through filter 102, the output of which is coupled to mixer 104, where the output of filter 102 is mixed with the output of a first local oscillator. The output of mixer 104 is passed through IF filter 106, the output of which is coupled to mixer 108, where the output of IF filter 106 is mixed with the output of a second local oscillator. The output of mixer 108 is the desired receiver baseband signal. Similarly, on the transmit side, an input signal (Tx Baseband) is coupled to a mixer 110, where it is mixed with the output of a first local oscillator. The output of mixer 110 is passed through IF filter 112, and the output of IF filter 112 is coupled to mixer 114 to be mixed with the output of a second local oscillator. The output of mixer 114 is passed through filter 116 to become the desired output signal (Tx Out). The first and second local oscillators for the receive path are not necessarily the same as the first and second local oscillators for the transmit path.

As noted above, the filters shown and described in connection with the superheterodyne architecture, which are typically implemented with components such as inductors and capacitors, are undesirable in modern electronic products generally, and in consumer electronic products particularly, because of the space and costs associated with these filters.

Figure 2:
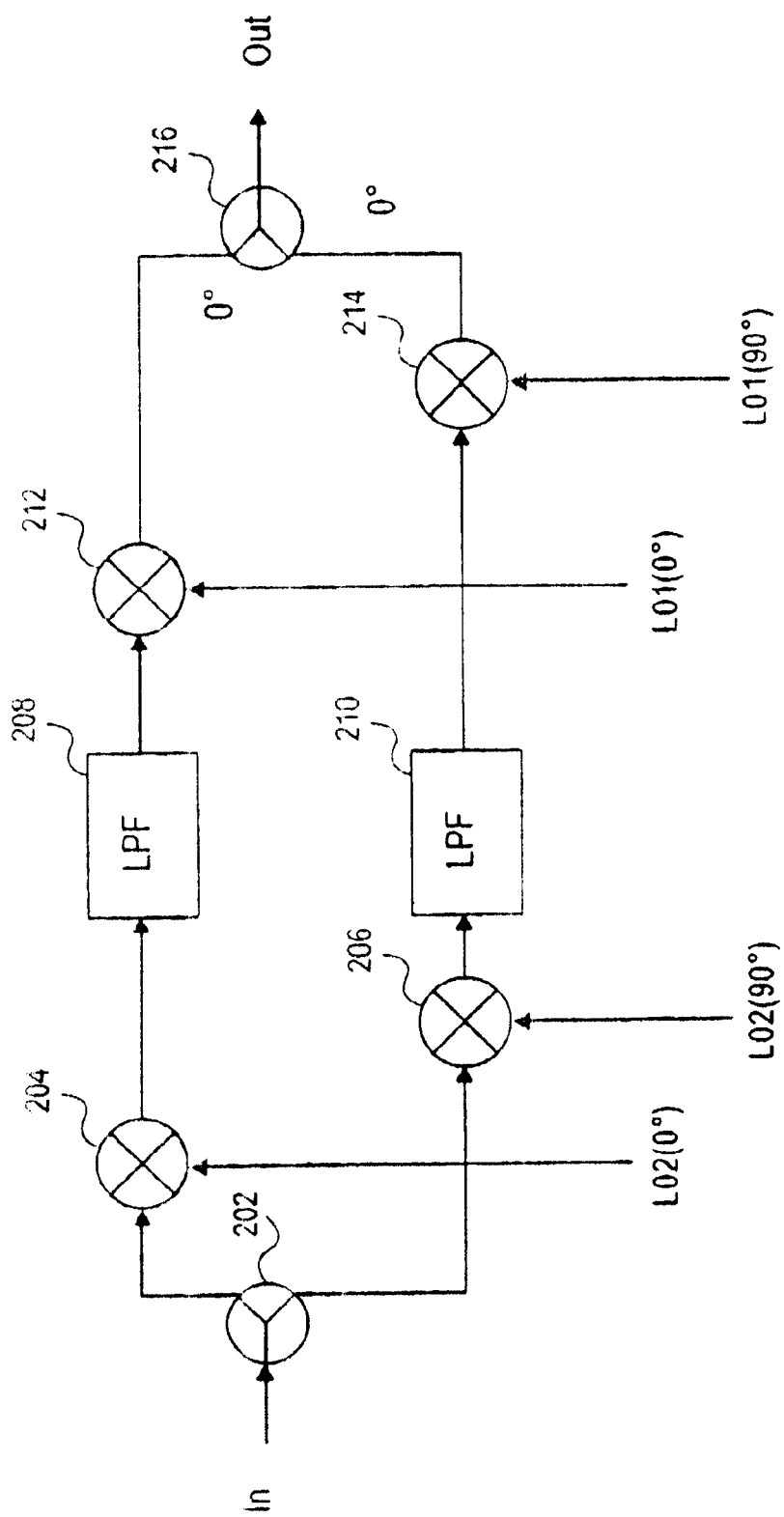
FIG. 2 is a circuit block diagram of a Weaver image reject mixer architecture having two phase-locked loop based local oscillators.

An alternative to the superheterodyne approach is the image reject mixer. A particular architecture, or class of, image reject mixers, sometimes referred to as the "Weaver Image Reject Mixer" architecture, is shown in FIG. 2. More particularly, an input signal is provided to an in-phase power splitter 202, an in-phase local oscillator signal, LO2(0°), is provided to a mixer 204, a quadrature local oscillator signal, LO2(90°), is provided to a mixer 206, an in-phase local oscillator signal, LO1(0°), is provided to a mixer 212, and a quadrature local oscillator signal, LO1(0°), is provided to a mixer 214. Mixer 204 mixes an in-phase input signal with an in-phase LO2 signal which is low-pass filtered by filter 208 to select the lower sideband, and that filtered signal is mixed at mixer 212 with an in-phase LO1 signal to produce an output signal which is provided to an input terminal of in-phase combiner 216. Mixer 206 mixes an in-phase input signal with a quadrature LO2 signal which is low-pass filtered by filter 210 to select the lower sideband, and that filtered signal is mixed at mixer 214 with a quadrature LO1 signal to produce an output signal which is provided to an input terminal of in-phase combiner 216. Combiner 216 provides the desired output signal. The Weaver Image Reject Mixer of FIG. 2 requires two local oscillators, which usually implies two frequency synthesizers.

As illustrated in FIG. 2, the Weaver image reject mixer acts as a downconverter. It is noted however, that the overall topology of the Weaver image reject mixer shown in FIG. 2 can be used as an upconverter by replacing low pass filters 208, 210 with high pass filters. In this way the upper sidebands rather than the lower sidebands at the IF stage are selected. In other words, the Weaver image reject mixer architecture can be referred to generally as a Weaver converter, since it can be used, to implement an upconverter or a downconverter.

Various embodiments of the present invention provide methods and apparatus for implementing downconversion or upconversion with image rejection in radio receivers and transmitters respectively, based on a Weaver image reject mixer architecture. More particularly, the image reject mixer architecture is modified such that a fine frequency step size is achieved without the noisy performance or slow settling time associated with conventional implementations that depend on fine step size phase-locked loops. More generally, embodiments of the present invention may be used for frequency synthesis whether or not they are used in conjunction with an image reject mixer.

It is noted that the Weaver image reject mixer architecture uses two local oscillators, and that these oscillators are conventionally implemented with phase-locked loops. In accordance with the present invention, using two independent phase-locked loops, it is possible to achieve a frequency step size that is finer than that of either phase-locked loop alone. This has utility since the noise performance of a phase-locked loop based frequency synthesizer is inversely proportional to step size. That is, noisy performance, as well as slow settling time, are associated with fine frequency step size in phase-locked loops.

As is well known, basic phase-locked loops typically include three basic blocks, namely a phase detector, a filter, and a voltage controlled oscillator (VCO). In such phase-locked loops, two signals are applied to a phase detector, the output of which is a function of the phase difference between the two signals. One of the two signals applied to the phase detector is typically referred to as a reference signal. The second of the two signals is typically the output of the VCO, or a signal derived from the output of the VCO. The output of the phase detector, which is representative of the phase difference between the reference signal, and the other signal whose phase is to be adjusted by the phase-locked loop, is often referred to as an error signal. The error signal, is typically applied to an input terminal of the VCO in such a manner that the phase of the output signal generated by the VCO, or the phase of a signal derived from the VCO, approaches that of the reference signal until the two signals are "phase-locked". The filter referred to above, is typically a low-pass filter, and is coupled to the output of the phase detector to properly condition the error signal which controls the VCO.

Some phase-locked loops, such as those found in embodiments of the present invention, also include circuitry in the pathway between the VCO output and the phase detector input. In various embodiments of the present invention, this circuitry implements frequency divider functionality. That is, as a consequence of dividing the frequency in the feedback path of the phase-locked loop by various amounts, the frequency of the VCO output signal is changed.

Figure 3:
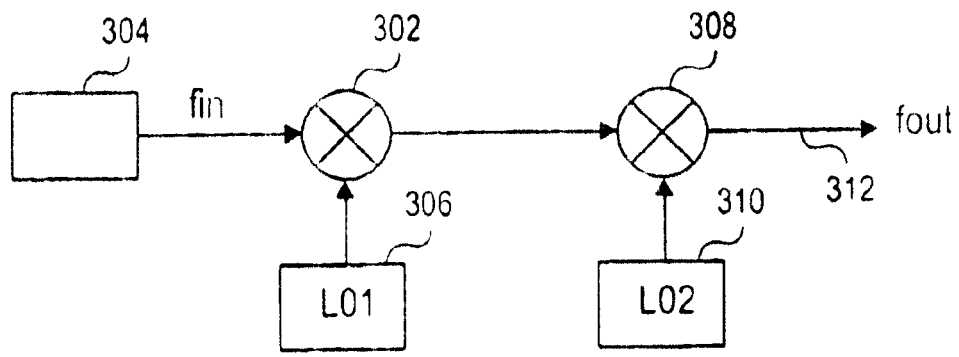
FIG. 3 is a general circuit block diagram, in accordance with the present invention, for implementing a fine resolution frequency step size.

In a phase-locked loop, $F_{out}=N\times(\text{step size})$, where $F_{out}$ is the output frequency, and N is an integer. Referring to FIG. 3, a circuit architecture for implementing fine frequency step size resolution is shown. More particularly, the circuit architecture of FIG. 3 can achieve a predetermined frequency step size of X. As shown in the figure, a first input terminal of a first mixer 302 is coupled to an output terminal of a first signal source 304, and a second input terminal of first mixer 302 is coupled to an output terminal of a first local oscillator 306. First local oscillator 306, in this illustrative embodiment, is designed to have a frequency step size equal to NX. An output terminal of first mixer 302 is coupled to a first input terminal of a second mixer 308, and an output terminal of a second local oscillator 310 is coupled to a second input terminal of second mixer 308. Second local oscillator 308, in this illustrative embodiment, is designed to have a frequency step size of MX. Second mixer 308 provides an output signal ($F_{out}$) at node 312.

X is the arbitrarily fine resolution step size that is desired for a particular embodiment. NX and MX are the step sizes of the first and second local oscillators respectively. N and M are integers with the constraint that i times $M=N\pm1$, where i is an integer. For example, if M=4 and N=25, then i would equal the integer 6. Each of the local oscillators, or frequency synthesizers, includes a phase-locked loop, and these local oscillators, or frequency synthesizers, further include input terminals, or other suitable means, for receiving control signals relating to the desired output frequency of the local oscillator, or frequency synthesizer. By providing such control signals, the output frequency of each local oscillator, or frequency synthesizer, can be changed in accordance with its predetermined frequency step size.

It is noted that the term, "coupled", as used herein, includes both direct connection of one or more circuit elements, and the indirect connection between such elements wherein various other circuit elements including but not limited to, wires, conductors, and passive or active devices are included in a pathway between the coupled elements.

In operation, first mixer 302 receives and mixes signals from first signal source 304 and first local oscillator 306. As is known in this field, the mixing operation is one which multiplies the input signals thereby producing signal components at frequencies which are the sum and difference of the frequencies of the input signals. There are many circuits, well-known in this field, for implementing mixer functionality. In this illustrative embodiment, the output of first mixer 302 is further processed so that the upper sideband is selected. This processing is typically accomplished by means of a band-pass filter. The filtered output signal of first mixer 302 is mixed with the output signal of second local oscillator 310 to produce an output signal on node 312. In this illustrative embodiment, the upper sideband of the output second mixer 308 is further processed so that the upper sideband is selected. This processing is typically accomplished by means of a band-pass filter, and results in the production of the output signal, $F_{out}$, referred to above.

Still referring to the operation of the circuit shown in FIG. 3, by varying the values of M and N, $F_{out}$ will have a step size of X, where X is smaller than the step size of either of the phase-locked loop based first local oscillator 306 or second local oscillator 310. Operation of the local oscillators to change their output frequencies (i.e., varying the values of M and N) is typically accomplished by programming a divider in the phase-locked loop to produce a different output frequency. Various circuits for performing frequency division in the feedback path between the VCO and phase detector of a phase-locked loop are well known in this field, and are not described in greater detail herein.

Figure 4:
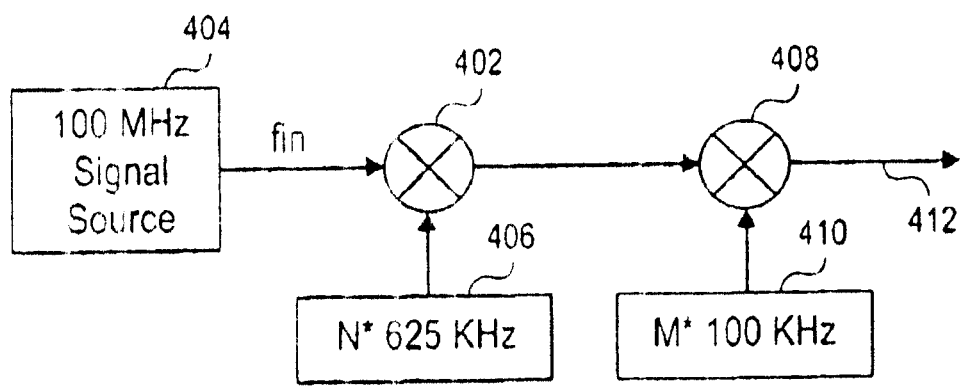
FIG. 4 is a circuit block diagram, in accordance with the present invention, of an illustrative embodiment for implementing a fine frequency step size resolution.

A more specific example is set forth below in connection with FIG. 4 and Table I. The circuit architecture shown in FIG. 4 is the same as that shown in FIG. 3, except that some specific values are shown for purposes of illustration. In this illustrative example, the first local oscillator has a 625 KHz frequency step size (i.e., 25(25 KHz)), and the second local oscillator has a 100 KHz frequency step size (i.e., 4(25 KHz)). In view of this difference in the magnitudes of their respective step sizes, the first local oscillator may be referred to as being coarse, or the coarse frequency synthesizer, and the second local oscillator may be referred to as being fine, or the fine frequency synthesizer. Using such an arrangement allows the total Weaver architecture converter of this example to have a 25 KHz frequency step size.

Referring now to FIG. 4, a first input terminal of a first mixer 402 is coupled to an output terminal of a first signal source 404 (which provides a 100 MHz signal in this illustrative embodiment), and a second input terminal of first mixer 402 is coupled to an output terminal of a first local oscillator 406 (which provides a signal having a frequency equal to N times 625 KHz). As indicated, first local oscillator 406, in this illustrative embodiment, is designed to have a frequency step size equal to 625 KHz. An output terminal of first mixer 402 is coupled to a first input terminal of a second mixer 408, and an output terminal of a second local oscillator 410 (which provides a signal having a frequency equal to M times 100 KHz) is coupled to a second input terminal of second mixer 408. As indicated, second local oscillator 408, in this illustrative embodiment, is designed to have a frequency step size of 100 KHz. Second mixer 408 provides an output signal (Fout) at node 412. N and M are integers with the constraint that i times M=N±1, where i is an integer.

The operation of the circuit of FIG. 4 is the same as that of the circuit of FIG. 3. That is, first mixer 402 receives and mixes signals from first signal source 404 and first local oscillator 406, and the output signal of first mixer 402 is mixed with the output signal of second local oscillator 410 to produce an output signal, Fout, on node 412. With N equal to 25, and the first local oscillator output step size set to 625 KHz (i.e., 25(25 KHz)), M equal to 4, and the second local oscillator output step size set to 100 KHz (i.e., 4(25 KHz)), Fout has 25 KHz steps. After the operational characteristics of the local oscillators, such as the frequency step size, are established as described above, N and M may be varied such that by mixing, the desired range of output signals at step size X is achieved. In one illustrative example, Table I shows the output frequency in 25 KHz steps as a function of varying N and M.

TABLE I

| fin (MHz) | N | LO1 (MHz) | Mixer1out (upper sideband) (MHz) | M | LO2 (MHz) | Fout (upper sideband) (MHz) |
|---|---|---|---|---|---|---|
| 100 | 1000 | 625.000 | 725.000 | 500 | 50.000 | 775.000 |
| 100 | 1001 | 625.625 | 725.625 | 494 | 49.400 | 775.025 |
| 100 | 1002 | 626.250 | 726.250 | 488 | 48.800 | 775.050 |
| 100 | 1003 | 626.875 | 726.875 | 482 | 48.200 | 775.075 |
| 100 | 1000 | 625.000 | 725.000 | 501 | 50.100 | 775.100 |
| 100 | 1001 | 625.625 | 725.625 | 495 | 49.500 | 775.125 |
| 100 | 1002 | 626.250 | 726.250 | 489 | 48.900 | 775.150 |
| 100 | 1003 | 626.875 | 726.875 | 483 | 48.300 | 775.175 |
| 100 | 1000 | 625.000 | 725.000 | 502 | 50.200 | 775.200 |
| 100 | 1001 | 625.625 | 725.625 | 496 | 49.600 | 775.225 |
| 100 | 1002 | 626.250 | 726.250 | 490 | 49.000 | 775.250 |
| 100 | 1003 | 626.875 | 726.875 | 484 | 48.400 | 775.275 |
| 100 | 1004 | 627.500 | 727.500 | 478 | 47.800 | 775.300 |

The various values for N and M, as, for example, shown in Table I above, can be generated by either a closed form algorithm or by a table look-up approach.

Referring to the illustrative set of values shown in Table I, it can be seen by inspection that in order for the output frequency, $F_{out}$, to move up 25 KHz, the coarse synthesizer is made to move up one step (+625 KHz), and the fine synthesizer is made to move down 6 steps (−600 KHz). similarly, to go down 25 KHz, the coarse synthesizer is made to go down one step (−625 KHz) and the fine synthesizer is made to move up 6 steps (+600 KHz). In other words, to create the 25 KHz frequency steps in the final output, the fine synthesizer jumps six steps when the coarse synthesizer jumps one step.

Still referring the illustrative embodiment represented by FIG. 4 and Table I, additional implementation details are provided as follows. First establish the frequency range for both frequency synthesizers based upon practical considerations, such as for example, VCO range, spurious responses, etc., as well as the needs of this exemplary embodiment. Then, select a frequency for the coarse synthesizer that yields the proper decimal part of the desired output frequency (in this example, 0.000 or 0.025 or 0.050 or 0.075 MHz). Next, compute the fine PLL frequency to make up the difference. In this case, the coarse synthesizer steps have a modulo-4 repetition stemming from the fine synthesizer step divided by the ultimate resolution (100 KHz/25 KHz=4). The fine synthesizer will jump in groups of 6 steps (as mentioned above), as the overall system moves in 25 KHz increments.

In accordance with the illustrative embodiment of the present invention, the intermediate frequency (IF) bandwidth increases by a factor of four as compared to a conventional Weaver architecture converter in which the fine synthesizer has 25 KHz steps. This is because the first local oscillator (i.e., the coarse frequency synthesizer) is put at one of four 625 KHz steps to achieve the ultimate resolution of 25 KHz.

Embodiments of the present invention can be used generally to produce an output signal which is adjustable in steps that are finer, that is, smaller, than the step sizes of the phase-locked loop oscillators which are used to synthesize the output signal. In a particular illustrative embodiment, the present invention may be used to provide one or more signals as inputs to one or more mixers in a circuit such as a Weaver Image Reject Mixer.

CONCLUSION

Thus, it can be seen from the above descriptions, that methods and apparatus for synthesizing a range of frequencies with fine granularity, or resolution, have been described.

Further, it can be seen from the above descriptions, that methods and apparatus for improving the noise and settling time performance in Weaver image reject mixers having fine resolution frequency step size have been described.

An advantage of some embodiments of the present invention is that, fine resolution frequency steps are achieved without the noisy performance or slow settling time associated with conventional phase-locked loops having fine step size.

While the present invention has been described in terms of the above-described embodiments, those skilled in the art will recognize that the invention is not limited to the embodiments described. The present invention can be practiced with modification and alteration within the spirit and scope of the appended claims. Thus, the description is to be regarded as illustrative of, rather than restrictive on, the present invention.

What is claimed is:

1. A method of producing a signal, comprising:
providing a first signal having a first frequency;
providing a second signal, the second signal having a frequency that is adjustable by a first step size;
providing a third signal, the third signal having a frequency that is adjustable by a second step size;
producing a fourth signal; and
mixing the third signal with the fourth signal to produce a fifth signal; wherein producing the fourth signal comprises mixing the first signal with the second signal; wherein the units of the first and second step sizes are Hz, the frequency of the second signal is the first step size times N, where N is an integer, the frequency of the third signal is the second step size times M where M is an integer, and i times M is equal to N±1, where i is an integer.

2. The method of claim 1, wherein providing the second signal comprises operating a first local oscillator.

3. The method of claim 1, wherein providing the third signal comprises operating a second local oscillator.

4. The method of claim 1, wherein providing the second signal comprises operating a first local oscillator, providing the third signal comprises operating a second local oscillator, and each of the first and second local oscillators includes a phase-locked loop.

5. The method of claim 4, further comprising bandpass filtering an output signal produced by the mixing of the first signal and the second signal.

6. The method of claim 5, wherein the band pass filtering selects an upper sideband of the output signal produced by the mixing of the first signal and the second signal.

7. The method of claim 6, further comprising selecting an upper sideband of the fifth signal.

8. The method of claim 5, wherein band pass filtering selects a lower sideband of the output signal produced by the mixing of the first signal and the second signal.

9. The method of claim 8, further comprising selecting a lower sideband of the fifth signal.

10. The method of claim 5, wherein providing the first signal comprises receiving the first signal.

11. The method of claim 5, wherein providing the first signal comprises generating the first signal.

12. The method of claim 5, further comprising providing at least one predetermined pair of values for N and M.

13. A method of down converting a signal, comprising:
providing a first, second, third, fourth and fifth signal, wherein the second signal has a frequency L2, the third signal has the frequency L2 and is phase shifted 90° with respect the second signal; the fourth signal has a frequency L1, and the fifth signal has the frequency L1 and is phase shifted 90° from the fourth signal;
splitting the first signal to produce a first splitter output signal and a second splitter output signal;
mixing the first splitter output signal with the second signal to produce a first mixer output signal, and low pass filtering the first mixer output signal to produce a first filter output signal;
mixing the second splitter output signal with the third signal and low pass filtering to produce a second mixer output signal, low pass filtering the second mixer output signal to produce a second filter output signal;
mixing the first filter output signal with the fourth signal to produce a third mixer output signal;
mixing the second filter output signal with the fifth signal to produce a fourth mixer output signal; and
combining the third mixer output signal and the fourth mixer output signal to produce a combiner output signal;
wherein frequency L2 is adjustable by a first step size, frequency L1 is adjustable by a second step size, frequency L2 is the first step size times N, frequency L1 is the second step size times M, and i times M is equal to N±1, where i, M and N are integers.

14. The method of claim 13, wherein providing the second, third, fourth and fifth signals comprises operating at least two local oscillators, each local oscillator including a phase-locked loop.

15. The method of claim 14, further comprising changing the output frequency of at least one of the least two local oscillators.

16. A method of upconverting a signal, comprising:
providing a first, second, third, fourth and fifth signal, wherein the second signal has a frequency L2, the third signal has the frequency L2 and is phase shifted 90° with respect the second signal; the fourth signal has a frequency L1, and the fifth signal has the frequency L1 and is phase shifted 90° from the fourth signal;
splitting the first signal to produce a first splitter output signal and a second splitter output signal;
mixing the first splitter output signal with the second signal to produce a first mixer output signal, and high pass filtering the first mixer output signal to produce a first filter output signal;

mixing the second splitter output signal with the third signal and high pass filtering to produce a second mixer output signal, low pass filtering the second mixer output signal to produce a second filter output signal;

mixing the first filter output signal with the fourth signal to produce a third mixer output signal;

mixing the second filter output signal with the fifth signal to produce a fourth mixer output signal; and combining the third mixer output signal and the fourth mixer output signal to produce a combiner output signal;

wherein frequency L2 is adjustable by a first step size, frequency L1 is adjustable by a second step size, frequency L2 is the first step size times N, frequency L1 is the second step size times M, and i times M is equal to N±1, where i, M and N are integers.

17. The method of claim 16, wherein providing the second, third, fourth and fifth signals comprises operating at least two local oscillators, each local oscillator including a phase-locked loop.

18. The method of claim 16, further comprising changing the output frequency of at least one of the least two local oscillators.

19. The method of claim 16, further comprising changing the frequency L2 by an integer multiple of the first step size, and changing the frequency L1 by an integer multiple of the second step size.

20. A circuit, comprising:
a first local oscillator having a first step size, the first local oscillator having an output terminal;
a first mixer having a first input terminal adapted to receive a first signal, a second input terminal coupled to the output terminal of the first local oscillator, and further having an output terminal;
a second local oscillator having a second step size, the second local oscillator having an output terminal; and
a second mixer having a first input terminal coupled to the output terminal of the first mixer, a second input terminal coupled to the output terminal of the second local oscillator, and further having an output terminal;
wherein first and second local oscillators each comprise a phase-locked loop, and the first step size is NX, the second step size is MX, X has units of Hz, and i times M equals N±1, where i, M and N are integers.

21. The circuit of claim 20, further comprising a filter coupled to the output of the first mixer.

22. The circuit of claim 21, wherein the filter is a high pass filter.

23. The circuit of claim 22, wherein the filter is a low pass filter.

24. The circuit of claim 21, further comprising a first signal source coupled to the first input terminal of the first mixer.

25. The circuit of claim 21, further comprising a third mixer coupled to a fourth mixer, the third mixer coupled to a quadrature output terminal of the first local oscillator and the fourth mixer coupled to a quadrature output terminal of the second local oscillator.

26. The circuit of claim 20, wherein the first and second local oscillators each include at least one input terminal adapted to receive information regarding a desired output frequency of that local oscillator.

27. A converter for radio applications, suitable for integration on a single chip, comprising:
a first and a second frequency synthesizer, each comprising a phase-locked loop, and each adapted to provide an in-phase output signal at an in-phase output signal terminal, and a quadrature output signal at a quadrature output signal terminal;
a first and a second mixer coupled, respectively, to the in-phase and quadrature output signal terminals of the first local oscillator;
a third and a fourth mixer coupled, respectively, to the in-phase and quadrature output signal terminals of the second local oscillator;
a power splitter having a first output terminal coupled to the first mixer, and a second output terminal coupled to the second mixer;
a combiner having a first input terminal coupled to an output terminal of the third mixer, and a second input terminal coupled to an output terminal of the fourth mixer;
a first filter coupled to an output terminal of the first mixer and further coupled to an input terminal of the third mixer;
a second filter coupled to an output terminal of the second mixer and further coupled to an input terminal of the fourth mixer; and
a signal source coupled to an input terminal of the power splitter; wherein the first frequency synthesizer has a first step size NX, the second frequency synthesizer has a second step size MX, and iM=N±1, where N, M and i are integers.

28. The converter of claim 27, wherein the first and second filters are low-pass filters and the converter is a downconverter.

29. The converter of claim 27, wherein the first and second filters are high-pass filters and the converter is an upconverter.

30. The converter of claim 27, wherein the first and second filters are bandpass.

31. An image reject mixer, comprising:
a first and a second local oscillator, each comprising a phase-locked loop, and each adapted to provide an in-phase output signal at an in-phase output signal terminal, and a quadrature output signal at a quadrature output signal terminal;
a first and a second mixer coupled, respectively, to the in-phase and quadrature output signal terminals of the first local oscillator;
a third and a fourth mixer coupled, respectively, to the in-phase and quadrature output signal terminals of the second local oscillator;
a first power splitter having a first output terminal coupled to the first mixer, and a second output terminal coupled to the second mixer;
a combiner having a first input terminal coupled to an output terminal of the third mixer, and a second input terminal coupled to an output terminal of the fourth mixer;
a first filter coupled to an output terminal of the first mixer and further coupled to an input terminal of the third mixer; and
a second filter coupled to an output terminal of the second mixer and further coupled to an input terminal of the fourth mixer; wherein the first local oscillator has a first step size NX, the second local oscillator has a second step size MX, and iM=N±1, where N, M and i are integers.

32. The circuit of claim 31, wherein the first and second filters are bandpass filters.

33. The circuit of claim 32, wherein the bandpass filters are low-pass filters.

34. The circuit of claim 32, wherein the bandpass filters are high-pass filters.

35. The circuit of claim 32, further comprising a signal source coupled to an input terminal of the power splitter.

* * * * *